US006963240B2

(12) United States Patent
Bonaccio et al.

(10) Patent No.: US 6,963,240 B2
(45) Date of Patent: Nov. 8, 2005

(54) DAMPING OF LC RINGING IN IC (INTEGRATED CIRCUIT) POWER DISTRIBUTION SYSTEMS

(75) Inventors: Anthony R. Bonaccio, Shelburne, VT (US); Allen P. Haar, State College, PA (US); Michael A. Sorna, Hopewell Junction, NY (US); Ivan L. Wemple, Shelburne, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 10/707,171

(22) Filed: Nov. 25, 2003

(65) Prior Publication Data

US 2005/0110551 A1 May 26, 2005

(51) Int. Cl.[7] .............................. G05F 1/10; G05F 3/02
(52) U.S. Cl. ........................ 327/544; 327/545; 323/233
(58) Field of Search ................................. 327/544, 545, 327/546, 548; 323/204, 210, 211, 208, 293, 323/233; 307/98, 99, 80, 102

(56) References Cited

U.S. PATENT DOCUMENTS

| | | | | |
|---|---|---|---|---|
| 4,860,148 A | * | 8/1989 | Iwamura et al. ............... 361/58 |
| 5,049,841 A | * | 9/1991 | Cooper et al. ............ 333/81 R |
| 5,151,668 A | * | 9/1992 | Kim ........................... 332/124 |
| 5,816,492 A | * | 10/1998 | Charles et al. ............ 236/78 R |
| 6,781,355 B2 | * | 8/2004 | Gauthier et al. ............ 323/233 |
| 6,822,345 B2 | * | 11/2004 | Gauthier et al. .............. 307/64 |
| 2001/0017574 A1 | * | 8/2001 | Oka ....................... 331/116 R |
| 2004/0165406 A1 | * | 8/2004 | Gauthier et al. .............. 363/39 |

* cited by examiner

*Primary Examiner*—Tuan T. Lam
(74) *Attorney, Agent, or Firm*—Schmeiser, Olsen & Watts; Anthony Canale

(57) ABSTRACT

A structure and method for damping LC (inductance-capacitance) ringing in integrated circuit (IC) power distribution systems. The structure comprises a resistance electrically connected in parallel with a plurality of electrical switches. The resistance and electrical switches are electrically connected in series with the package and on-chip power distribution circuit. When on-chip switching activity creates a sudden and appreciable change in IC power demand the electrical switches are opened to temporarily increase the resistance in series with the power supply. This serves to dampen the power-distribution LC ringing. Later, the electrical switches are closed to shunt the series resistance and reduce the level of steady-state voltage drop in the power structure.

14 Claims, 3 Drawing Sheets

DAMPING OF LC RINGING IN IC (INTEGRATED CIRCUIT) POWER DISTRIBUTION SYSTEMS

BACKGROUND OF INVENTION

1. Technical Field

The present invention relates to damping of LC (inductance-capacitance) ringing effects, and more specifically, to damping of LC ringing effects in IC (Integrated Circuit) power distribution systems.

2. Related Art

In typical IC implementations, circuit activity may be characterized by sudden changes in power demand. For example, the use of clock gating in sequential circuits can suddenly induce or eliminate logic-signal switching in large circuit blocks, by activating or suppressing the application of clock signals to every flip-flop in a clock domain. Whenever the domains are turned on and off, the corresponding and abrupt change in power demand generates a system step response, characterized by an oscillating transient voltage variation across the chip power distribution system (board, package, and on-chip power grid). The response period is a strong function of the power system's inductance and capacitance, and the response phenomenon is often called "LC ringing." The reciprocal of the voltage drop period is called the system "resonant frequency." Owing to resistance in the power distribution network, the step response is "damped", meaning that, over time, the amplitude of the voltage response will eventually decay to a small, steady-state value (the "AC response"). However, any subsequent and significant changes in chip power demand will re-introduce the LC ringing and the corresponding modulation of the power supply voltage. This transient "power noise" can induce functional design failures, or even degrade the reliability of the on-chip circuits. Both outcomes are undesirable.

To reduce the impact of power noise, a power distribution structure is needed which responds differently to sudden changes in power demand. Specifically, a system is needed in which the circuit voltage level, in response to power demand variation, oscillates at lower amplitudes and more quickly decays to the steady-state AC response, as compared to power distribution systems in the prior art. A method is also needed for integrating and operating such a structure in IC applications.

SUMMARY OF INVENTION

The present invention provides a structure, comprising (a) an IC power distribution circuit; (b) a resistor electrically connected in series with the circuit; (c) an electrical switch electrically connected in parallel with the resistor; and (d) a controller, electrically connected to the electrical switch, wherein the controller is configured to open the electrical switch to reduce the transient voltage variation across the circuit.

The present invention provides a method, comprising the steps of (a) providing an IC power distribution circuit, a resistor electrically connected in series with the circuit, an electrical switch electrically connected in parallel with the resistor, and a controller electrically connected to the electrical switch; and (b) causing the controller to open the electrical switch to reduce the transient voltage variation across the circuit.

The present invention also provides a method for damping transient voltage variation in an IC power distribution circuit, the method comprising the steps of (a) providing a resistor electrically connected in series with the circuit; (b) providing an electrical switch and one or a plurality of additional electrical switches connected in parallel with the resistor, the first electrical switch and additional electrical switch or plurality of additional electrical switches initially being closed; (c) opening the first electrical switch; opening the additional electrical switch or plurality of additional electrical switches; and (d) closing the first and additional electrical switch or plurality of additional electrical switches at some later time.

The present invention provides structures for damping the variation of voltage across an IC power distribution system.

The present invention also provides methods for operating such structures to dampen the variation of voltage across an IC power distribution system.

DETAILED DESCRIPTION

Figure 1:
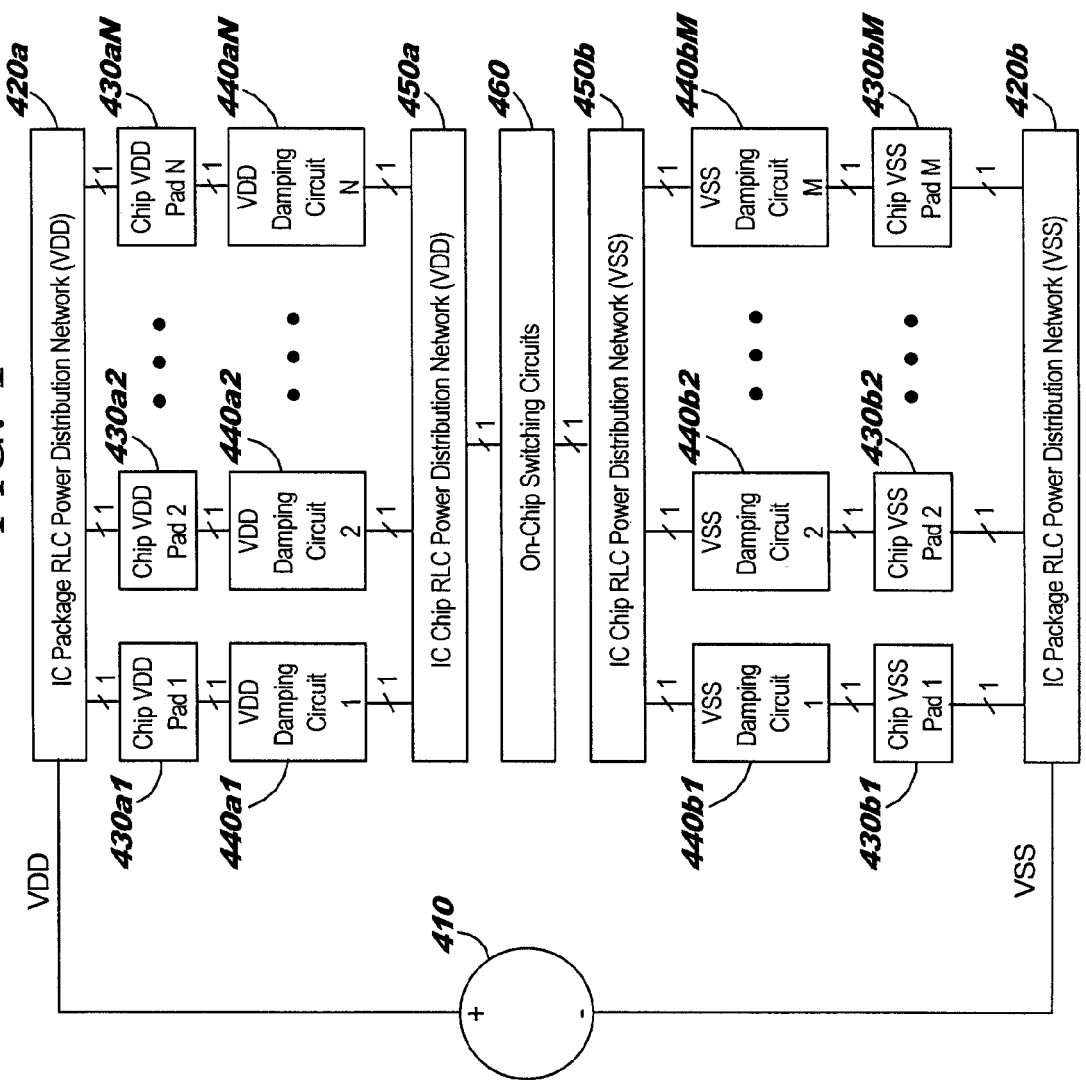
FIG. 1 illustrates a structure comprising the system power supply, the package and chip RLC (resistance inductance capacitance) power distribution networks, the chip power pads, on-chip IC switching circuits, and the damping circuits, in accordance with embodiments of the present invention.

FIG. 1 illustrates an IC configuration comprising an ideal power supply 410, RLC circuits representing the (resistive, inductive, and capacitive) parasitics of the package 420, and chip VDD and VSS power distribution networks, on-chip switching circuits 460, and a plurality of damping circuits 440 inserted between the package 420 and chip RLC power structures 450, in accordance with embodiments of the present invention.

One or a plurality of damping circuit(s) 440*a* and the package "VDD" RLC circuit 420*a* are electrically connected to one, a subset, or all of the chip VDD pads 430*a*. The damping circuit(s) 440*a* connected to the package "VDD" RLC circuit 420*a* are also connected to the chip "VDD" RLC circuit 450*a*. One or a plurality of damping circuit(s) 440*b* and the package "VSS" RLC circuit 420*b* are electrically connected to one, a subset, or all of the chip VSS pads 430*b*. The damping circuit(s) 440*b* connected to the package "VSS" RLC circuit 420*b* are also connected to the chip "VSS" RLC circuit 450*b*.

In one embodiment, when a sudden change in power demand is exhibited by the on-chip switching circuits 460, the on-chip switching circuits 460 are initially subjected to a transient voltage variation (i.e., the "onset" of LC ringing). The voltage variation detected at the on-chip circuits 460 triggers activation of the damping circuits 440. In response, the damping circuits 440 introduce additional series resistance in the IC power distribution network 450, and serve to dampen the LC ringing. Thus, the dampened voltage response observed at the switching circuits 460 exhibits less peak-to-peak variation (when compared to the prior art configuration without damping circuits), and more quickly decays to a stable, small oscillation which corresponds to the frequency of on-chip switching. This small oscillation or "steady-state AC response" is characteristic of IC implementations with or without damping circuits 440.

Figure 2:
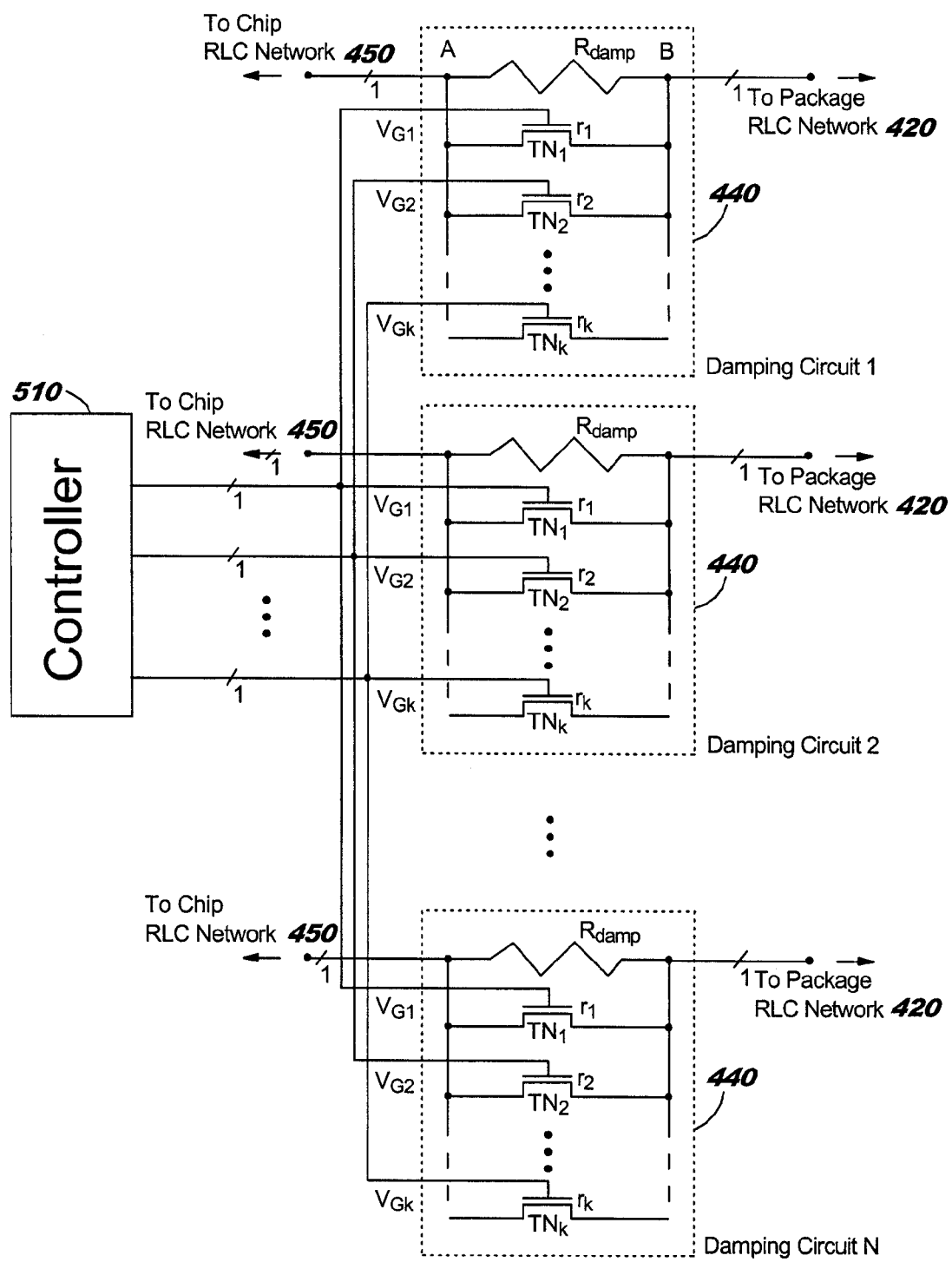
FIG. 2 illustrates a controller and several damping circuits of FIG. 1, each comprising a resistor, and a plurality of transistor switches, in accordance with embodiments of the present invention.

FIG. 2 illustrates one possible configuration of the damping circuits 440 of FIG. 1, in accordance with embodiments of the present invention. In addition, FIG. 2 illustrates an on-chip controller circuit 510 used to activate or deactivate one or more damping circuit(s) 440. Each damping circuit 440 comprises a resistor $R_{damp}$, and one or a plurality of transistor switches, $T_{N1}$, $T_{N2}$, ... $T_{Nk}$.

The first damping circuit resistor $R_{damp}$ in FIG. 2 is electrically connected between nodes A and B. The resistor has resistance $R_{damp}$ (the same symbol is used to indicate the resistor and its resistance). The transistor switches $T_{N1}$, $T_{N2}$, ... $T_{Nk}$ are also electrically connected between nodes A and B. In other words, the damping circuit resistor $R_{damp}$ and the transistor switches $T_{N1}$, $T_{N2}$, ... $T_{Nk}$ are electrically connected between nodes A and B in parallel. Practically speaking, any physical switch implementation has a small, finite resistance, even when the switch is electrically "closed." When activated, then, the transistor switches $T_{N1}$, $T_{N2}$, ... $T_{Nk}$ have resistance values of $r_1$, $r_2$, ... $r_k$, respectively. When the transistor switches $T_{N1}$, $T_{N2}$, ... $T_{Nk}$ are not conducting (i.e., "OFF"), their non-conducting resistances approach infinity (i.e., they are open circuits), and therefore, $r_1=r_2= \ldots r_k=\infty$ (infinity). In one embodiment, the transistor switches $T_{N1}$, $T_{N2}$, ... $T_{Nk}$ are designed such that, when they are "ON" (i.e., conducting), their conducting resistances are identical ($r_1=r_2= \ldots =r_k=r$), and significantly smaller than $R_{damp}$ (i.e., $r<<R_{damp}$).

Because the resistor $R_{damp}$ and the transistor switches $T_{N1}$, $T_{N2}$, ... $T_{Nk}$ are electrically connected between nodes A and B in parallel, the equivalent resistance between node A and node B, namely $R_{AB}$, can be computed using the relationship (1) below:

$$1/R_{AB}=1/R_{damp}+1/r_1+1/r_2+ \ldots +1/r_k \quad (1)$$

The controller 510 is configured to deliver control voltage signals $V_{G1}$, $V_{G2}$, ... $V_{Gk}$ to the gate terminals of the transistor switches $T_{N1}$, $T_{N2}$, ... $T_{Nk}$, respectively. In one embodiment, the transistor switches $T_{N1}$, $T_{N2}$, ... $T_{Nk}$ are designed to be conducting (i.e., "ON") when voltage values associated with a binary or logical "1" are applied to signals $V_{G1}$, $V_{G2}$, ... $V_{Gk}$. Similarly, switches $T_{N1}$, $T_{N2}$, ... $T_{Nk}$ are designed to be non-conducting (i.e., "OFF") when voltage values associated with a binary or logical "0" are applied to signals $V_{G1}$, $V_{G2}$, ... $V_{Gk}$. The voltage values applied to $V_{G1}$, $V_{G2}$, ... $V_{Gk}$ are independent, meaning that signals corresponding to a binary or logical "1" can be applied to some of the transistor switches $T_{N1}$, $T_{N2}$, ... $T_{Nk}$, and signals corresponding to a binary or logical "0" can be simultaneously applied to the other switches. In one embodiment, initially, the controller 510 sets the control voltage signals $V_{G1}$, $V_{G2}$, ... $V_{Gk}$ to a voltage level corresponding to a binary "1". In this configuration, the transistor switches $T_{N1}$, $T_{N2}$, ... and $T_{Nk}$ are conducting (i.e., "ON"). Therefore, it can be inferred from (1) that:

$$R_{AB} \approx r/k \quad (2a)$$

for the embodiments in which $r_1=r_2= \ldots =r_k=r<<R_{damp}$, and wherein the symbol "$\approx$" indicates "approximately equal".

In one embodiment, a sudden change in on-chip power demand is detected by the controller 510, which sets the control signal $V_{G1}$ to a voltage value corresponding to a binary or logical "0". As a result, the transistor switch transistor $T_{N1}$ becomes non-conducting (i.e., $T_{N1}$ is turned "OFF"). Therefore, it can be inferred from (1) that:

$$R_{AB} \approx r/(k-1) \quad (2b)$$

If, at some time later, the controller sets the control signal $V_{G2}$ to a voltage value corresponding to a binary or logical "0", then transistor switch $T_{N2}$ becomes non-conducting (i.e., $T_{N2}$ is turned "OFF"). Therefore, it can be inferred from (1) that:

$$R_{AB} \approx r/(k-2) \quad (2c)$$

If, at some time later, the controller 510 sets the control signal $V_{Gk}$ to a voltage value corresponding to a binary or logical "0", then transistor switch $T_{Nk}$ becomes non-conducting (i.e., $T_{Nk}$ is turned "OFF"). If all of the other transistor switches $T_{N1}$, $T_{N2}$, .... $T_{Nk-1}$ are each in their non-conducting configuration (i.e., "OFF"), then all of the transistor switches $T_{N1}$, $T_{N2}$, ... $T_{Nk}$ are non-conducting, and, it can be inferred from (1) that:

$$R_{AB} \approx R_{damp} \quad (3)$$

In summary, by turning off the transistor switches $T_{N1}$, $T_{N2}$, ... $T_{Nk}$, one by one, in sequence, the controller and control signals, $V_{G1}$, $V_{G2}$, ... $V_{Gk}$, act to gradually increase resistance $R_{AB}$ from $r/k$ to $r/(k-1)$ to $r/(k-2)$, and so forth, until $R_{AB}$ eventually reaches a value of $R_{damp}$ (corresponding to the configuration where all transistor switches $T_{N1}$, $T_{N2}$, ... $T_{Nk}$ are non-conducting). As a result, the voltage variation (i.e., LC ringing) appearing at the on-chip switching circuits 460 (FIG. 1), in response to a sudden change in on-chip power demand, is dampened due to the gradually increased resistance $R_{AB}$ in series with the chip and package RLC power distribution networks 450 and 420 (FIG. 1), respectively.

Note that the transformation in damping circuit resistance, $R_{AB}$, as represented by equations (1), (2a), and (3), also applies when transistor switches $T_{N1}$, $T_{N2}$, ... $T_{Nk}$ are initialized in their conducting (i.e., "ON") states, and then simultaneously turned "OFF". In practice, however, since abrupt or sudden changes in power system resistance may also induce power supply voltage variation, the embodiment corresponding to sequential switching is preferred.

In one embodiment, when the voltage variation subsequently observed at the on-chip switching circuits 460 has decayed to a small, tolerable, steady-state oscillation, the controller 510 sets each control signal $V_{G1}$, $V_{G2}$, ... $V_{Gk}$ to a voltage level corresponding to a binary "1". As a result, transistor switches $T_{N1}$, $T_{N2}$, ... $T_{Nk}$ are turned "ON", and resistance $R_{AB}$ is reduced (significantly) to $r/k$ [equation (2a)]. Reducing the series resistance at this step is desirable for minimizing the system "static IR drop", which ensures reliable operation and the rated performance of the on-chip switching circuits 460 in the steady state. Here, for reasons described previously, it may be preferable turn the transistor switches "ON" sequentially. As described, the exemplary embodiments use transistors to implement the switch elements in the damping circuits. Note, however, that, in general, any type of electrical switch which can be electrically configured to control its conducting (versus non-conducting) state can be employed.

Figure 3:
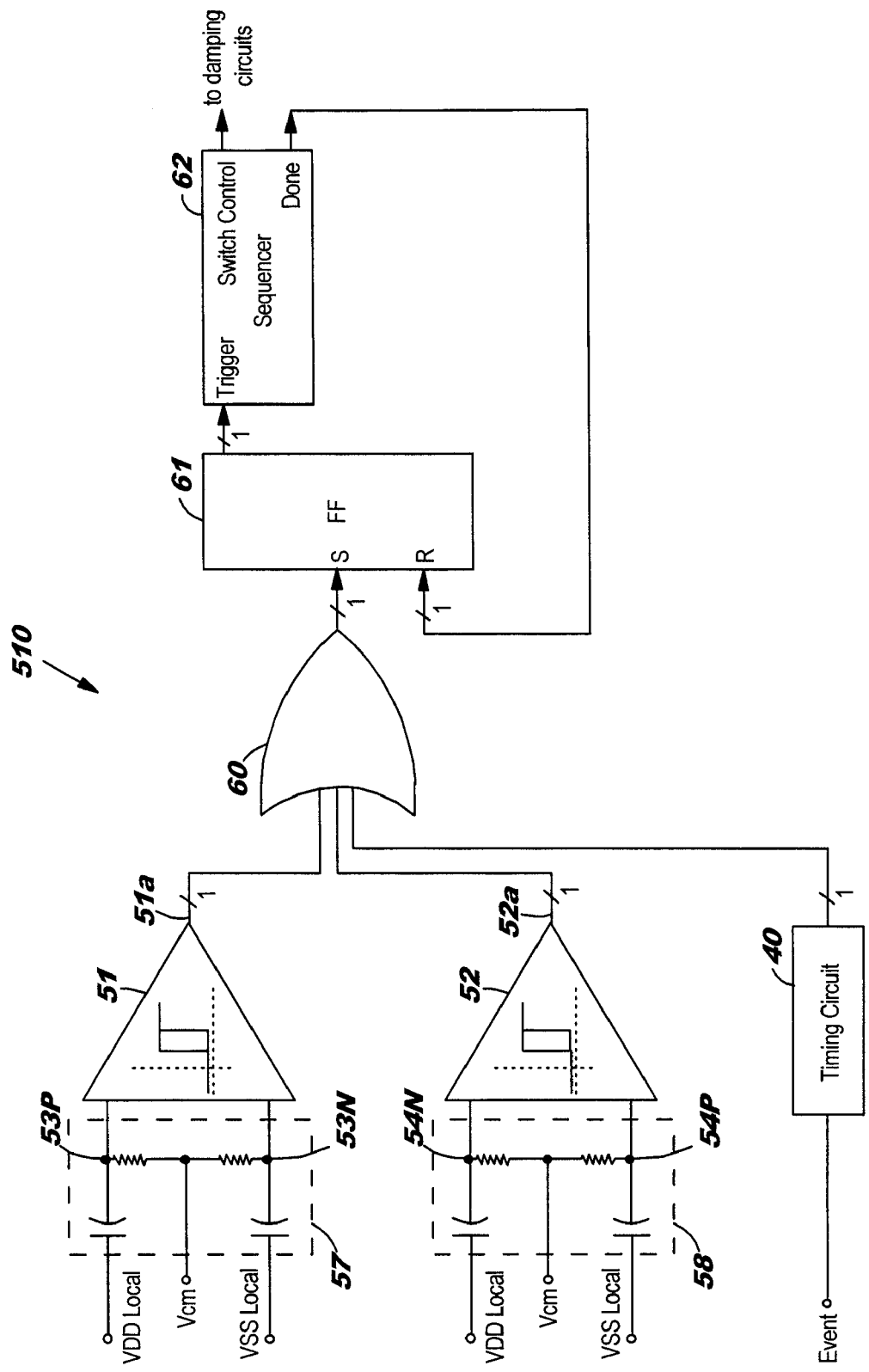
FIG. 3 illustrates the controller of FIG. 2, in accordance with embodiments of the present invention.

FIG. 3 illustrates the controller 510 of FIG. 2, in accordance with embodiments of the present invention. The controller 510 comprises a timing circuit 40, an SR (Set-Reset) flip-flop 61, a digital "sequencer" 62, two comparators 51 and 52, two high-pass filters 57 and 58, and a 3-input OR gate 60.

The controller circuit 510 has 3 input signals, "Event", "$VDD_{local}$", and "$VSS_{local}$".

The timing circuit 40 is designed to detect a logical transition of digital signal "Event" (i.e., a transition from logical "1" to logical "0", a transition from logical "0" to logical "1", and/or both), and to generate a corresponding digital voltage pulse that transitions from logic level "0" to logic level "1", and then, after a short period of time, back to logic level "0".

Signals "$VDD_{local}$" and "$VSS_{local}$" represent potential monitors: "$VDD_{local}$" is a representation of the positive chip power supply voltage (VDD), measured in the vicinity of the controller, and "$VSS_{local}$" is a representation of the negative chip power supply voltage (VSS), also measured in the vicinity of the controller. Physically, signals "$VDD_{local}$" and "$VSS_{local}$" are implemented as wires connected between the controller 510 and nearby portions of the chip VDD and VSS RLC power distribution networks 450a and 450b (FIG. 1), respectively.

Collectively, the controller comparators 51 and 52 comprise a "glitch detection circuit" and, when configured in the described fashion, serve to detect positive or negative disturbances on the power supply. With the aid of OR gate 60, the circuit signals the occurrence of such disturbances as a binary indication.

Comparators 51 and 52 are differential comparators, whose differential inputs 53p/n and 54p/n are coupled to input signals "$VDD_{local}$" and "$VSS_{local}$" through differential high pass filters 57 and 58. The polarity of the coupling between input signals "$VDD_{local}$" and "$VSS_{local}$", and differential high pass filters 57 and 58, is reversed, to allow for the detection of both positive and negative disturbances on the power supply. Differential high-pass filters 57 and 58 are referenced to some common-mode voltage $V_{cm}$ suitable for operation of comparators 51 and 52. Ideally, "$VDD_{local}$" and "$VSS_{local}$" signals having a frequency less than the designed −3 dB frequency of high pass filters 57 and 58 are attenuated, and do not appear at the inputs to comparators 51 and 52. Such signals include the DC difference between local power supply signals "$VDD_{local}$" and "$VSS_{local}$", and any small, AC steady-state difference in those signal voltages. When only DC and small or low frequency components are present in signals "$VDD_{local}$" and "$VSS_{local}$", inputs 53p/n and 54p/n to comparators 51 and 52 remain at voltage levels close to $V_{cm}$, the common-mode voltage.

Comparators 51 and 52 have a voltage threshold greater than zero and, optionally, exhibit some hysteresis so that the voltage threshold for rising signals is greater than that for falling signals. Operation of the comparators is such that a binary "1" indication is produced at comparator outputs 51a and 52a whenever the differential voltage exceeds the voltage threshold for certain rising signals. This occurs when the input transient power supply voltage variation, as passed through filters 57 and 58, has an amplitude which exceeds the voltage threshold. The optional hysteresis may be needed to help widen the resulting output pulse for transient signals that pass through the threshold quickly in both directions.

The outputs of the timing circuit 40 and comparators 51 and 52 serve as inputs to 3-input OR gate 60, whose output is connected to the "SET" input of SR flip-flop 61. When signal "Event" transitions or a positive or negative high-frequency disturbance of appreciable amplitude occurs on the power supply rails near the controller 510, the output of the timing circuit 40 or either comparator 51 or 52 toggles briefly. As a result, the output of 3-input OR gate 60 also toggles briefly. This logical state change is latched by flip-flop 61 and the flip-flop output transition (signal "Trigger") activates the sequencer 62 to initiate the damping circuit transistor switch sequence described previously, via control signals $V_{G1}$, $V_{G2}$, ... $V_{Gk}$ (FIG. 2). After activating the damping circuit operation, sequencer 62 asserts its binary "Done" output to reset SR flip-flop 61. This reset conditions the controller 510 to accommodate the next "Event" transition or high-frequency power-supply disturbance.

In one embodiment, when on-chip switching circuits induce sudden changes in power demand resulting from "anticipated" events, the circuit implementation can be configured to generate an appropriate "Event" signal by using the control logic associated with the anticipated activity. For example, the binary state transition of the "CLOCK ENABLE" logic signal employed to activate/deactivate circuit-block clock gating can be used explicitly to generate the "Event" signal shown in FIG. 3. In this case, the "Event" input to timing circuit 40 causes the output of timing circuit 40 to briefly toggle. As a result, the output of 3-input OR gate 60 also toggles briefly. This state change is latched by flip-flop 61 and the flip-flop output transition (signal "Trigger") activates the sequencer 62 to initiate the damping circuit transistor switch sequence, via control signals $V_{G1}$, $V_{G2}$, ... $V_{Gk}$ (FIG. 2). In response to applying control signals $V_{G1}$, $V_{G2}$, ... $V_{Gk}$ to the gate terminals of transistor switches $T_{N1}$, $T_{N2}$, ... $T_{Nk}$, the series resistance of each damping circuit 440 (FIG. 2) is modulated in accordance with the embodiments described above. In other words, the sequencer 62 has been preprogrammed to turn transistor switches $T_{N1}$, $T_{N2}$, ... $T_{Nk}$ "OFF" and "ON" in a specific sequence, and in accordance with a specific relationship in time. At the end of the sequence, the sequencer 62 asserts its binary "Done" output to reset the SR flip-flop 61. This reset conditions the controller 510 to accommodate any subsequent activation of the damping circuits 440.

In one embodiment, transient power supply fluctuations created by LC ringing are not "anticipated", but are instead "detected". In this scenario, the power supply voltage variation is said to be "unanticipated". For example, certain unpredictable data patterns may occasionally produce circuit activity corresponding to large and sudden changes in chip power demand. In some instances, this change in power demand creates a power supply disturbance in which the voltage difference "$VDD_{local}$" minus "$VSS_{local}$" suddenly and appreciably decreases. In other instances, the change in power demand creates a power supply disturbance in which the voltage difference "$VDD_{local}$" minus "$VSS_{local}$" suddenly and appreciably increases. However, for any disturbance corresponding to a sudden and appreciable change in the voltage difference "$VDD_{local}$" minus "$VSS_{local}$", comparator 51 or 52 toggles briefly. As a result, the output of 3-input OR gate 60 also toggles briefly. This state change is latched by flip-flop 61 and the flip-flop output transition (signal "Trigger") activates the sequencer 62 to initiate the damping circuit switch sequence, via control signals $V_{G1}$, $V_{G2}$, ... $V_{Gk}$ (FIG. 2). In response to applying control signals $V_{G1}$, $V_{G2}$, ... $V_{Gk}$ to the gate terminals of transistor switches $T_{N1}$, $T_{N2}$, ... $T_{Nk}$, the series resistance of each damping circuit 440 is modulated in accordance with the embodiments described above. In other words, the sequencer 62 has been preprogrammed to turn transistor switches $T_{N1}$, $T_{N2}$, ... $T_{Nk}$ "OFF" and "ON" in a specific sequence, and in accordance with a specific relationship in time. At the end of the sequence, the sequencer 62 asserts its binary "Done" output to reset the SR flip-flop 61. This reset conditions the controller 510 to accommodate any subsequent activation of the damping circuits 440.

In summary, by controlling the ON/OFF states of the transistor switches $T_{N1}$, $T_{N2}$, ... $T_{Nk}$ which comprise the damping circuit 440, the equivalent resistance $R_{AB}$, in series with the VDD and VSS package and on-chip power distribution networks (FIG. 1), can be adjusted. Whenever on-chip switching circuits are subjected to power distribution LC ringing (anticipated or unanticipated), the voltage disturbance or "Event" signal generation toggles at least one of the three OR gate 60 input signals (i.e., the output signal of timing circuit 40, the output signal of comparator 51, and/or the output signal of comparator 52). The corresponding OR gate output transition triggers activation of the sequencer 62 via SR flip-flop 21. The sequencer 62 then exercises its programmed sequence of turning "OFF" and "ON" the transistor switches $T_{N1}, T_{N2}, \ldots T_{N3}$. More specifically, the sequencer 62 turns "OFF" transistors $T_{N1}, T_{N2}, \ldots T_{Nk}$, simultaneously, to increase the equivalent resistance $R_{AB}$ from r/k to $R_{damp}$, so as to dampen the voltage step response observed by the on-chip circuits. In an alternative embodiment, the sequencer 62 turns "OFF" transistors $T_{N1}, T_{N2}, \ldots T_{Nk}$, one-by-one, so as to gradually increase the equivalent resistance $R_{AB}$. In both embodiments, after a pre-determined time period associated with the power system LC resonant frequency, sequencer 62 restores the system to its nominal state by turning "ON" transistors $T_{N1}, T_{N2}, \ldots T_{Nk}$ either sequentially or simultaneously thus reducing the equivalent resistance (and associated static IR drop) observed at steady-state.

In one embodiment, a damping circuit like one of the exemplary damping circuits 440 shown in FIG. 2 is inserted in series between each or a subset of the chip power (i.e., VDD) pads 430a and the global on-chip power grid structure 450a for VDD. In another embodiment, a damping circuit like one of the exemplary damping circuits 440 shown in FIG. 2 is inserted in series between each or a subset of the chip ground (i.e., VSS) pads 430b and the global on-chip power grid structure 450b for VSS. In yet another embodiment, a damping circuit like one of the exemplary damping circuits 440 shown in FIG. 2 is inserted in series between each or a subset of the chip power (i.e., VDD) pads and the global on-chip power grid structure for VDD, and, additionally, a damping circuit is inserted in series between each or a subset of the chip ground (i.e., VSS) pads and the global on-chip power grid structure for VSS. In any such configuration, each damping circuit can be programmed to temporarily create additional on-chip power grid resistance to reduce the impact of system LC resonant behavior. During AC steady-state chip operation, the additional resistance can be shunted by turning on the damping-circuit parallel electrical switches, each operating in its conducting configuration.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising:
    an IC power distribution circuit;
    a resistor electrically connected in series with the circuit;
    an electrical switch electrically connected in parallel with the resistor; and
    a controller comprising a timing circuit and a sequencer electrically connected to the timing circuit and the electrical switch, wherein the timing circuit is configured to generate, with a predetermined delay, a timing circuit trigger input signal to the sequencer, in response to an event signal which signifies an anticipated sudden change in power demand in the on-chip switching circuits, and wherein the sequencer is configured to open the electrical switch in response to the generation of the timing circuit trigger signal, the controller being electrically connected to the electrical switch and being configured to open the electrical switch to reduce the transient voltage variation across the circuit.

2. The structure of claim 1, wherein the controller is further configured to close the electrical switch at some time after the controller initially opens the electrical switch.

3. The structure of claim 2, further comprising one or a plurality of additional electrical switches, each electrically connected in parallel with the resistor and the first electrical switch, wherein each additional electrical switch is electrically connected to the controller.

4. The structure of claim 1, wherein the electrical switch is a transistor.

5. The structure of claim 1, wherein the resistance of the electrical switch, while being closed, is substantially smaller than that of the resistor, and the resistance of the electrical switch, while being open, is substantially larger than that of the resistor.

6. A structures, comprising:
    an IC power distribution circuit;
    a resistor electric connected in series with the circuit;
    an electrical switch electrically connected in parallel with the resistor; and
    a controller comprising a first comparator and a sequencer electrically connected to the first comparator and the electrical switch, wherein the first comparator is configured to generate a first comparator trigger input signal to the sequencer, in response to the voltage across the power distribution circuit abruptly increasing, and wherein the sequencer is configured to open the electrical switch in response to the generation of the first comparator trigger signal, the controller being electrically connected to the electrical switch and being configured to open the electrical switch to reduce the transient voltage variation across the circuit.

7. The structure of claim 6, wherein the controller further comprises a second comparator electrically connected to the sequencer, wherein the second comparator is configured to generate a second comparator trigger input signal to the sequencer, in response to the voltage across the power distribution circuit abruptly decreasing, and wherein the sequencer is further configured to open the electrical switch in response to the generation of the second comparator trigger signal.

8. A method for operating a structure, the method comprising the steps of:
    providing an IC power distribution circuit, a resistor electrically connected in series with the circuit, an electrical switch electrically connected in parallel with the resistor, and a controller electrically connected to the electrical switch;
    causing the controller to open the electrical switch to reduce the transient voltage variation across the circuit;
    providing a timing circuit and a sequencer in the controller, the sequencer being electrically connected to the timing circuit and the electrical switch;
    causing the timing circuit to generate, with a predetermined delay, a timing circuit trigger signal input to the sequencer, in response to an event signal which signifies an anticipated sudden change in power demand in the on-chip switching circuits; and
    causing the sequencer to open the electrical switch in response to the generation of the timing circuit trigger signal.

9. The method of claim 8, further comprising the step of causing the controller to close the electrical switch at some time after the controller opens the electrical switch.

10. The method of claim 9, further comprising the steps of:
providing one or a plurality of additional electrical switches, each electrically connected in parallel with the resistor and electrically connected to the controller;
causing the controller to open each additional electrical switch; and
causing the controller to later close each additional switch, after causing the controller to open each additional electrical switch.

11. The structure of claim 8, wherein the electrical switch is a transistor.

12. The structure of claim 8, wherein the resistance of the electrical switch, while being closed, is substantially smaller than that of the resistor, and the resistance of the electrical switch, while being open, is substantially larger than that of the resistor.

13. A method for operating a structure, the method comprising the steps of:
providing an IC power distribution circuit, a resistor electrically connected in series with the circuit, an electrical switch electrically connected in parallel with the resistor, and a controller electrically connected to the electrical switch;
causing the controller to open the electrical switch to reduce the transient voltage variation across the circuit;
providing a first comparator and a sequencer in the controller, the sequencer being electrically connected to the first comparator and the electrical switch;
causing the first comparator to generate a first comparator trigger input signal to the sequencer, in response to the voltage across the power distribution circuit abruptly increasing; and
causing the sequencer to open the electrical switch in response to the generation of the first comparator trigger signal.

14. The method of claim 13, further comprising the steps of:
providing, in the controller, a second comparator electrically connected to the sequencer;
causing the second comparator to generate a second comparator trigger input signal to the sequencer, in response to the voltage across the power distribution circuit abruptly decreasing; and
causing the sequencer to open the electrical switch in response to the generation of the second comparator trigger signal.

* * * * *

UNITED STATES PATENT AND TRADEMARK OFFICE
CERTIFICATE OF CORRECTION

PATENT NO. : 6,963,240 B2
DATED : November 8, 2005
INVENTOR(S) : Bonaccio et al.

It is certified that error appears in the above-identified patent and that said Letters Patent is hereby corrected as shown below:

<u>Column 8,</u>
Line 23, delete "electric" and insert -- electrically --.
Line 26, delete "comparator and" and insert -- comparator, and --.

Signed and Sealed this

Twenty-fourth Day of January, 2006

JON W. DUDAS
*Director of the United States Patent and Trademark Office*